United States Patent [19]

Opower et al.

[11] Patent Number: 5,729,568
[45] Date of Patent: Mar. 17, 1998

[54] POWER-CONTROLLED, FRACTAL LASER SYSTEM

[75] Inventors: Hans Opower, Krailling; Helmut Huegel, Sindelfingen; Adolf Giesen; Friedrich Dausinger, both of Stuttgart, all of Germany

[73] Assignees: Deutsche Forschungsanstalt fuer Luft-und Raumfahrt e.V., Bonn; Universitaet Stuttgart Institut fur Strahlwerkzeuge, Stuttgart, both of Germany

[21] Appl. No.: 655,555

[22] Filed: May 30, 1996

Related U.S. Application Data

[63] Continuation of Ser. No. 302,940, filed as PCT/DE94/00037, Jan. 14, 1994 published as WO94/17576 Aug. 4, 1994, abandoned.

[30] Foreign Application Priority Data

Jan. 22, 1993 [DE] Germany ............ 43 01 689.8

[51] Int. Cl.⁶ .................................... H01S 3/08
[52] U.S. Cl. ................ 372/108; 385/116; 385/120
[58] Field of Search .............. 372/108; 385/115, 385/116, 120

[56] References Cited

U.S. PATENT DOCUMENTS

| | | |
|---|---|---|
| 3,590,248 | 6/1971 | Chatterton . |
| 4,637,685 | 1/1987 | Gordon . |
| 4,901,329 | 2/1990 | Leas . |
| 5,003,550 | 3/1991 | Welch et al. . |
| 5,025,451 | 6/1991 | Jansen et al. . |
| 5,100,220 | 3/1992 | Voegeli . |
| 5,337,325 | 8/1994 | Hwang .................................. 385/115 |
| 5,513,195 | 4/1996 | Opower et al. . |

FOREIGN PATENT DOCUMENTS

| | | |
|---|---|---|
| 2153969 | 5/1973 | Germany . |
| 58-145 984 | 8/1983 | Japan . |
| 61-29 803 | 2/1986 | Japan . |
| 61-103 688 | 5/1986 | Japan . |
| 61-186 914 | 8/1986 | Japan . |
| 61-200 683 | 12/1986 | Japan . |
| 62- 67 89 | 1/1987 | Japan . |
| 2-142 695 | 5/1990 | Japan . |
| 2-82 062 | 6/1990 | Japan . |
| 2-196 983 | 8/1990 | Japan . |
| 4-300 087 | 10/1992 | Japan . |
| 4-320 383 | 11/1992 | Japan . |

OTHER PUBLICATIONS

Berger et al; "Fiber-bundle Coupled, Diode End-Pumped Nd:YAG Laser"; Optics Letters; vol. 13, No. 4; Apr. 1988, pp. 306–308.

(List continued on next page.)

Primary Examiner—Rodney B. Bovernick
Assistant Examiner—Robert E. Wise
Attorney, Agent, or Firm—Barry R. Lipsitz

[57] ABSTRACT

In order to improve a semiconductor laser system with a plurality of semiconductor laser units comprising a laser oscillator, laser radiation exiting from each of these units, a light-conducting fiber associated with each semiconductor laser unit, a coupling element for coupling the laser radiation exiting from the respective semiconductor laser unit into the respective light-conducting fiber, and a fiber bundle comprising the fibers as light conductor system, a total laser radiation formed by the sum of the coherent laser radiation generated by the respective semiconductor laser units exiting from one end of the fiber bundle, this total laser radiation illuminating a target surface on an object to be irradiated during laser activity of all the semiconductor laser units, such that complex irradiation tasks can be performed with this system in a simple and as effective a manner as possible it is suggested that a control be provided for controlling the power of each individual semiconductor laser unit in a defined manner, and that an irradiation of different surface elements of the target surface with an intensity individually definable for each surface element be specifiable to the control.

31 Claims, 11 Drawing Sheets

OTHER PUBLICATIONS

J. Berger, et al., "Fiber–Bundle Coupled, Diode End–Pumped Nd:YAG Laser," *Optics Letters*, vol. 13, No. 4, Apr. 1988, pp. 306–308.

Y. Kaneda, et al., "7.6 W of Continuous–Wave Radiation in a $TEM_{00}$ Mode from a Laser–Diode End–Pumped Nd:YAG Laser," *Optics Letters*, vol. 17, No. 14, Jul. 15, 1992, pp. 1003–1005.

H. Zbinden, et al., "Q–Switched Nd:YLF Laser End Pumped by a Diode–Laser Bar," *Optics Letters*, vol. 15, No. 18, Sep. 15, 1990, pp. 1014–1016.

POWER-CONTROLLED, FRACTAL LASER SYSTEM

This application is a continuation of commonly assigned, U.S. patent application Ser. No. 08/302,940, filed as PCT/DE94/00037 Jan. 14, 1994, published as WO94/17576, Aug. 4, 1994, now abandoned.

The invention relates to a semiconductor laser system with a plurality of semiconductor laser units comprising a laser oscillator, laser radiation exiting from each of these units, a light-conducting fiber associated with each semiconductor laser unit, a coupling element for coupling the laser radiation exiting from the respective semiconductor laser unit into the respective light-conducting fiber, and a fiber bundle comprising the fibers as light conductor system, a total laser radiation formed by the sum of the coherent laser radiation generated by the respective semiconductor laser units exiting from one end of this fiber bundle, the total laser radiation illuminating a target surface on an object to be irradiated during laser activity of all the semiconductor laser units.

Semiconductor laser systems of this type are known. In these systems, for example, seven semiconductor laser units are combined to obtain a total laser radiation with which an object can be irradiated.

However, with such semiconductor laser systems only a simple laser irradiation can be carried out.

The object underlying the invention is therefore to improve a semiconductor laser system of the generic type such that complex radiation tasks can be performed with this system in a simple and as effective a manner as possible.

This object is accomplished in accordance with the invention, in a semiconductor laser system of the type described at the outset, in that a control is provided for controlling the power of each individual semiconductor laser unit in a defined manner and that an irradiation of different surface elements of the target surface with an intensity individually definable for each surface element is specifiable to the control.

The advantage of the present invention is therefore to be seen in the fact that a defined intensity can be specified by means of the control for each surface element of the target surface, which is possible by controlling the power of each individual semiconductor laser unit.

Thus, the inventive solution creates the possibility of carrying out complex irradiation tasks and, for example, of irradiating different surface elements within the target surface with different intensity in order to adjust the type of irradiation of surface areas of the target surface to the respective task to be accomplished in an optimum manner.

The inventive solution therefore represents an advantageous utilization of the fact that the total laser radiation is not generated by one laser system but by a plurality of semiconductor laser systems and makes systematic use of the fact that several semiconductor laser systems are used for this purpose to carry out complex irradiation tasks by a defined control of the power of the respective semiconductor laser units.

In a particularly advantageous embodiment, the laser radiation exiting from each semiconductor laser unit has a laser radiation field independent of the laser radiation of the other semiconductor units with respect to the intensity. This makes it possible in a particularly advantageous manner to determine a definable intensity for each of the different surface elements of the target surface.

This may be achieved even more advantageously when the laser radiation exiting from each semiconductor laser unit is decoupled from the laser radiation of the other semiconductor units with respect to its radiation field. This means that no radiation field interaction results between the laser radiations from the individual semiconductor laser units and, therefore, it is possible to set the intensity for each individual surface element particularly advantageously.

It is provided, in particular, for the laser radiation of a semiconductor laser unit coupled into the respective light-conducting fiber to be decoupled from the laser radiation of the other semiconductor laser units with respect to its radiation field in order to avoid radiation field interactions.

This may be realized particularly expediently when each of the semiconductor laser units has its own laser oscillator decoupled from the other semiconductor laser units with respect to its radiation field.

A particularly advantageous decoupling of the laser oscillators results when the laser oscillators of the semiconductor laser units are laser oscillators separated from one another.

In a further, particularly advantageous embodiment, the laser radiations forming the total laser radiation are decoupled from one another with respect to their radiation fields so that in the total laser radiation, as well, no interaction of the laser radiations with one another takes place via the radiation field and thus no feedback results during the defined specification of the intensity of the individual laser radiations.

The inventive solution provides, in particular, for the intensity of each individual semiconductor laser unit to be controllable with the control in a defined manner.

Moreover, the wavelength of the laser radiation can also be controlled in semiconductor laser units within certain limits so that it is advantageous for the wavelength of the laser radiation of each individual semiconductor laser unit to be specifiable with the control in a defined manner.

With respect to the manner, in which the laser radiation is conveyed from each semiconductor laser unit through the fibers to the end of the light conductor system and combined to form the total laser radiation of the light conductor system, no details have so far been given. It is, for example, particularly advantageous for fiber end faces of the fibers, from which the laser radiation of the associated semiconductor laser units exits, to be located, in the region of the end of the light conductor system, in an end surface of the light conductor system optically imageable onto the target surface. This is the prerequisite for being able to image all the fiber end faces together onto the target surface with an optical means and so the same imaging conditions apply for each fiber end face and, therefore, a simple imaging which is applicable for all the fiber end faces can be carried out.

This is necessary, in particular, when a high power density is intended to be achieved on the target surface since, in this case, the fiber end faces of the fibers should lie as close as possible to one another.

In this respect, a particularly advantageous semiconductor laser system of the inventive kind provides for a space between the fiber end faces in the end surface to be smaller than three times the fiber thickness. It is even more advantageous for the space between the fiber end faces to be smaller than twice the fiber thickness and, in the case of especially high power densities, the fiber end faces lie next to one another in the end surface, preferably border on one another.

With respect to the shape of the end surface, no more exact details have been given in conjunction with the embodiments described so far. In the simplest case, it would be conceivable for the end surface to have the shape of a plane since a plane can be easily imaged onto a target surface with customary imaging methods. It is, however, particularly advantageous for the shape of the end surface to be adapted to a shape of the surface of the object to be irradiated or a surface of the object forming during the irradiation in the region of the target surface.

Within the scope of the comments on the embodiments described so far, no details have been given with respect to how the laser radiation of the different semiconductor laser units is intended to impinge on the target surface. In an advantageous embodiment, for example, the laser radiation of different semiconductor laser units impinges at least partially on different surface elements of the target surface so that at least the laser radiation of one semiconductor laser unit or even several semiconductor laser units is associated with each surface element.

In the case of particularly complex irradiation tasks, it is expedient for the laser radiation of different semiconductor laser units to impinge on different surface elements of the target surface so that one semiconductor laser unit is clearly associated with each surface element of the target surface and the laser radiation of this semiconductor laser unit impinges on this surface element.

In order to achieve a multiple irradiation of the surface elements, or to be able to attain a high intensity or other effects, it is advantageous in a further embodiment for the laser radiation of each semiconductor laser unit to be superposed in part on the target surface with the laser radiation of other semiconductor laser units. Such a superposition need not merely be an addition of the intensity. A coherent superposition of several laser radiations can also take place, in addition.

Alternatively thereto, it is of advantage in other types of irradiation tasks, in particular selective irradiation of the target surface, for the laser radiation of each semiconductor laser unit to irradiate a respective surface element of the target surface without superposition with the laser radiation of the other semiconductor laser units.

It is especially expedient for an optical imaging means to be provided between the end of the light conductor system and the target surface so that defined imaging ratios can then be achieved between the end surface and the target surface.

In the simplest case, the optical imaging means images the fiber end faces onto the image surface in the ratio one to one.

It is, however, just as conceivable for the optical imaging means to image the fiber end faces onto the imaging surface on a smaller scale which is advantageous when aiming at particularly high intensities, or for the optical imaging means to image the fiber end faces onto the image surface on a larger scale in order to obtain a large, irradiated surface but with the loss of intensity.

In addition, it is advantageous for a shape of the end surface to be adapted to optical imaging properties of the optical imaging means. This means that with the shape of the end surface it is possible not only to adapt this, if necessary, to the shape of the surface of the object in the region of the target surface but also that with the shape of the end surface it is possible to adapt this to optical imaging properties of the optical imaging means in order to thereby compensate, for example, for imaging errors of the optical imaging means by way of the shape of the end surface.

With respect to the semiconductor laser units, no additional details have so far been given. In the simplest case, each semiconductor laser unit comprises a single laser-active diode strip.

It is, however, also conceivable for each semiconductor laser unit to comprise several laser-active diode strips.

In order to obtain as high a power as possible, it is advantageous for each semiconductor laser unit to comprise a laser oscillator and a laser amplifier.

It is preferable, in order to obtain properties of the laser radiation which are as defined as possible, for each semiconductor laser unit to operate in a stabilized mode operation.

In particular, it is expedient for each semiconductor laser unit to operate in the transversal basic mode.

Moreover, it is also advantageous for each semiconductor laser unit to operate in the longitudinal single-mode operation.

With respect to the fibers, from which the fiber bundle is formed, no details have so far been given. In an advantageous embodiment, for example, the fibers are single-mode fibers.

Particularly in the case of single-mode fibers, the laser radiation is coupled into each single-mode fiber with limited diffraction.

In conjunction with the explanation of the embodiments described thus far, no details have been given as to the wavelength ranges, for which the semiconductor laser units are designed. In the simplest embodiment, for example, all the semiconductor laser units are designed for the same wavelength range.

It is, however, also conceivable for different semiconductor laser units to be designed for different wavelength ranges.

In this respect, it is particularly expedient for the semiconductor laser units to comprise a group of semiconductor laser units having the same wavelength.

In an additional, advantageous embodiment, the semiconductor laser units comprise several groups of semiconductor laser units having the same wavelength within the respective groups.

In a case of this type, it is particularly advantageous for the fiber end faces of fibers irradiating laser radiation of differing wavelength to be combined to form a respective irradiation group and for the irradiation groups to be arranged next to one another in the end surface. In such an embodiment, the marking and beam visualization can be realized particularly advantageously since, in this case, only one group of semiconductor laser units need be configured such that it generates the laser radiation with a wavelength lying in the visible range.

In this case, the other group of semiconductor laser units can preferably be configured such that it, for example, generates the laser radiation required for the irradiation or treatment.

With respect to the coupling elements for the coupling of the fiber to the semiconductor laser unit, no details have so far been given. In a particularly advantageous embodiment, for example, an imaging element borne by the substrate of the semiconductor laser unit is provided as coupling element for the coupling of the fiber to the semiconductor laser unit.

The grating is expediently a reflection grating.

Alternatively thereto, it is conceivable to design the imaging element as a holographic-optical element.

An additional alternative provides for the imaging element to be a mirror integrated into the substrate.

The mirror is preferably designed such that it focuses the laser radiation onto the fiber.

An additional alternative provides for the imaging element to be a lens integrated into the substrate. This lens can be expediently designed as an index lens.

In an additional, advantageous embodiment of the inventive semiconductor system, the fiber bundle comprises detector fibers, whereby the detector fibers serve, in particular, to observe the target surface.

In this respect, it is preferable for one end of the detector fibers to be located at the end of the light conductor system.

In order to obtain the same imaging ratios as in the case of the total laser radiation, it is advantageous for the end of the detector fibers to be located in the end surface next to the fiber end faces so that, in the end, fiber end faces of the detector fibers are likewise located in the end surface.

This means that it is advantageously possible, when using an optical imaging means, to image the ends of the detector fibers onto the target surface.

Moreover, the target surface can be observed particularly easily in that an optical detector is arranged at another end of the detector fibers for observing the image surface.

This detector is preferably designed as a matrix detector and the detector fibers are preferably associated with the individual matrix points of the matrix detector such that with their fiber end faces a direct imaging of the target surface onto the matrix detector is possible.

In this respect, it is particularly expedient for a control to be provided which observes the intensity distribution in the target surface via the matrix detector and ensures a locally fixed radiation onto the object to be irradiated within the target surface due to a defined specification of the power for the individual semiconductor laser units.

The inventive laser system preferably provides for the use of a plurality, for example several tens or hundreds, of semiconductor laser units having powers from 1 to 3 watts in order to obtain powers of the total laser radiation of several hundred or even more than one thousand watts.

Additional features and advantages of the invention are the subject matter of the following description as well as the drawings of several embodiments.

Figure 1:
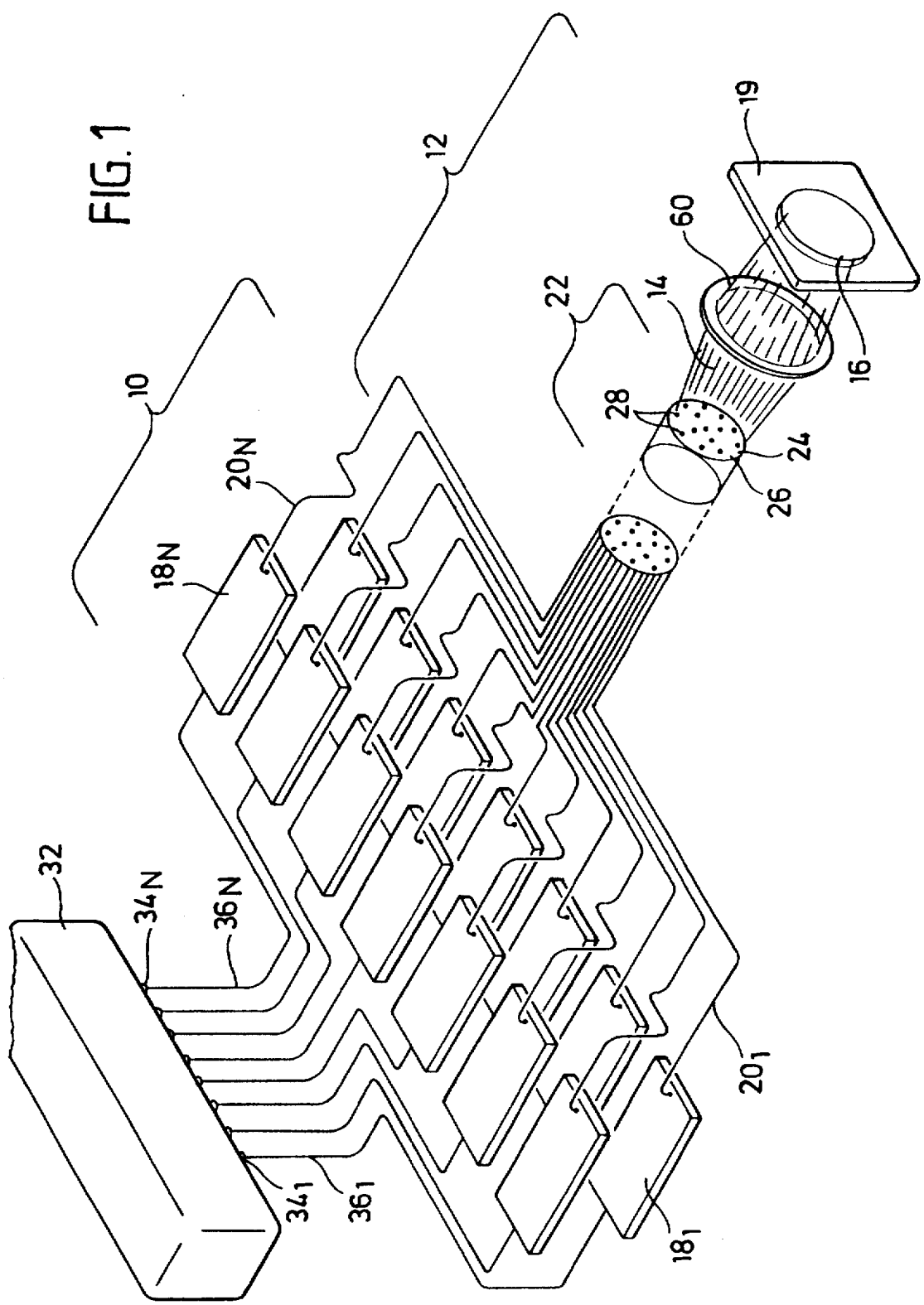
FIG. 1 is a perspective illustration of a first embodiment of an inventive semiconductor system.

One embodiment of an inventive, power-controlled, fractal laser system, illustrated in FIG. 1, comprises a radiation generator system 10 which is followed by a light conductor system 12, from which a total laser radiation 14 exits. This total laser radiation, for its part, impinges on a target surface 16 of an object 19 to be irradiated with the total laser radiation 14. The target surface is thereby defined as that surface which is illuminated during laser activity of all the semiconductor laser units.

The radiation generator system 10 comprises a plurality of semiconductor laser units $18_1$ to $18_N$, each of which generates laser radiation which is coupled into a respective light-conducting fiber $20_1$–$20_N$. The light-conducting fibers $20_1$ to $20_N$ are then combined to form a fiber bundle 22 which is comprised by the light conductor system 12. The fiber bundle 22 forms at one end 24, as illustrated in FIGS. 1 and 2, an end face 26, in which all the fiber end faces 28 of the fibers $20_1$ to $20_N$ forming the fiber bundle 22 are located.

Figure 2:
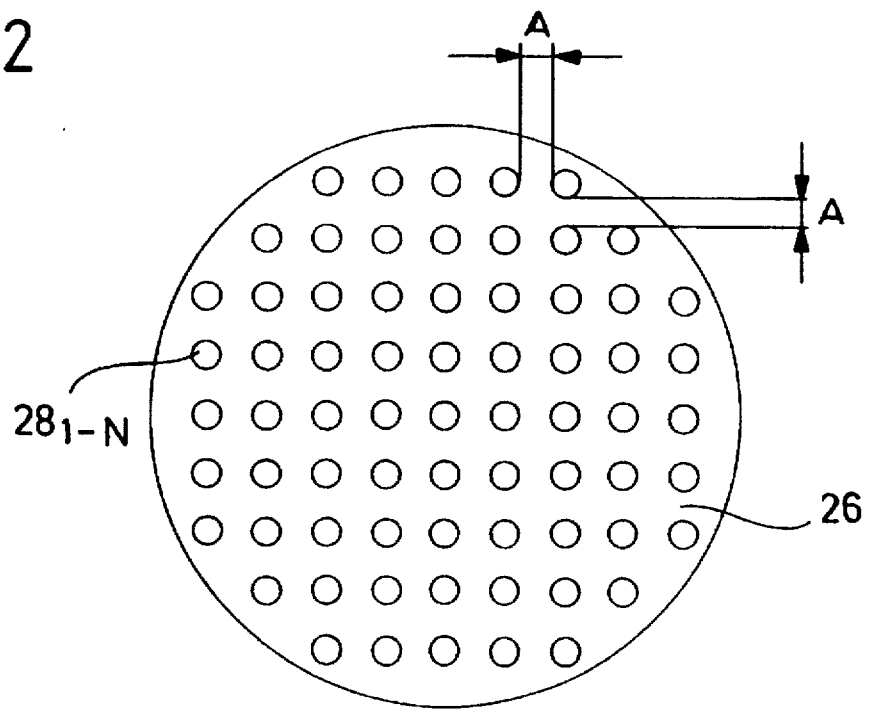
FIG. 2 is a schematic illustration of a plan view onto an end surface of the light conductor system in one variation.

The fiber end faces 28 are preferably arranged in the end face 26 such that they have a distance A from one another, whereby this distance A varies according to the corresponding embodiment (FIG. 2).

Figure 3:
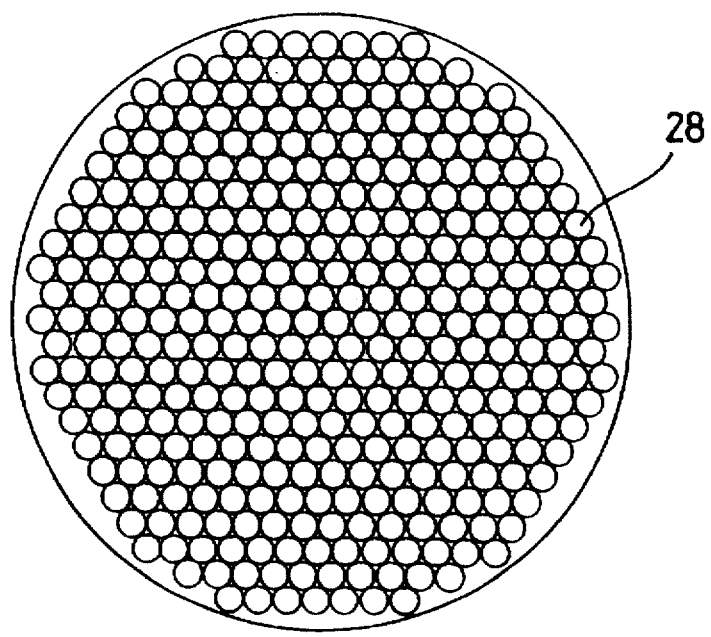
FIG. 3 is a schematic plan view similar to FIG. 2 in a second variation.

However, the distance A can, as illustrated, for example, in FIG. 3 in one variation, also approach zero so that the fiber end faces 28 touch one another.

Therefore, one fiber end face $28_1$ to $28_N$ belongs to each semiconductor laser unit $18_1$ to $18_N$ and the laser radiation generated by the respective semiconductor laser unit $18_1$ to $18_N$ exits essentially from each of these fiber end faces $28_1$ to $28_N$ and is added to the laser radiations of the remaining semiconductor laser units $18_1$ to $18_N$ to form the total laser radiation 14.

Figure 4:
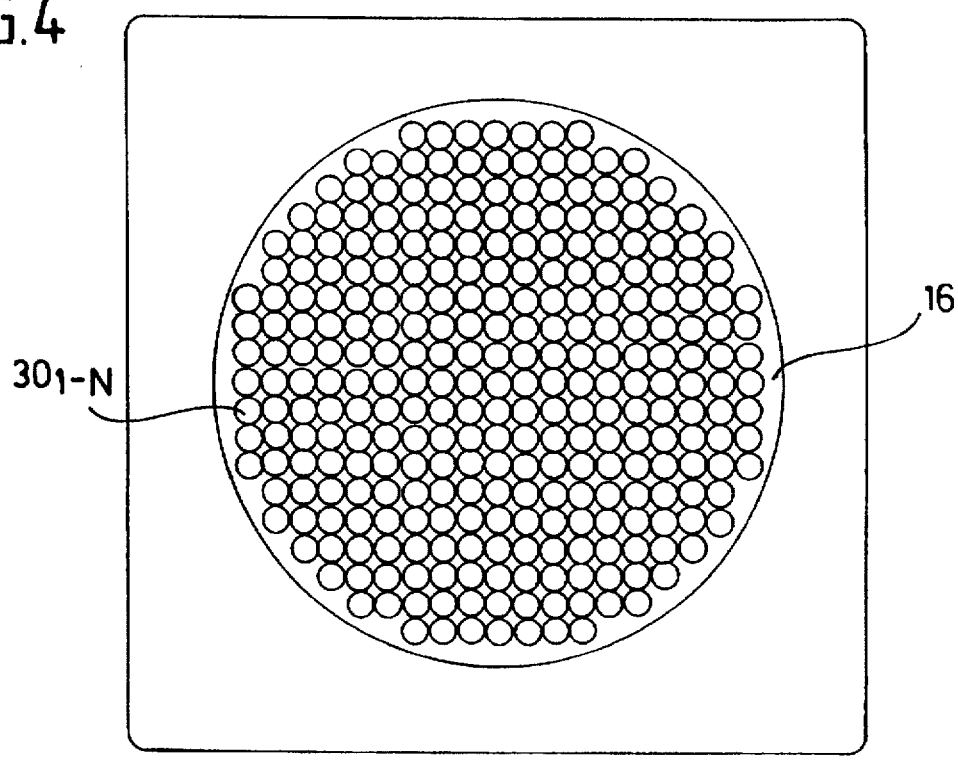
FIG. 4 is a schematic plan view onto a target surface.

Therefore, the total laser radiation 14 impinging on the target surface 16 likewise represents a bundle of the individual laser radiations of the individual semiconductor laser units $18_1$ to $18_N$. As illustrated in FIG. 4, in the case of a one-to-one imaging of the end surface 26 (FIG. 3) onto the target surface 16 a respective surface element $30_1$ to $30_N$ of the target surface 16 is irradiated by the laser radiation exiting from each fiber end face $28_1$ to $28_N$, and in this case the surface elements $30_1$ to $30_N$ do not overlap. The target surface is, in this respect, that surface in which all the surface elements $30_{1\ to\ N}$ corresponding to all the fiber end faces $30_{1\ to\ N}$ are located.

This means that one of the semiconductor laser units $18_1$ to $18_N$ is associated indirectly with each of the surface elements $30_1$ to $30_N$ within the target surface 16.

In accordance with the invention, the laser power in each of the individual surface elements $30_1$ to $30_N$ can be specified in a defined manner. For this purpose, the radiation generator system is, as illustrated in FIG. 1, provided with a control 32, via which each of the individual semiconductor laser units $18_1$ to $18_N$ can be controlled in a defined manner with respect to its power.

The control 32 has, for this purpose, a plurality of outputs $34_1$ to $34_N$, from which respective control lines $36_1$ to $36_N$ lead to the respective semiconductor laser units $20_1$ to $20_N$.

Figure 5:
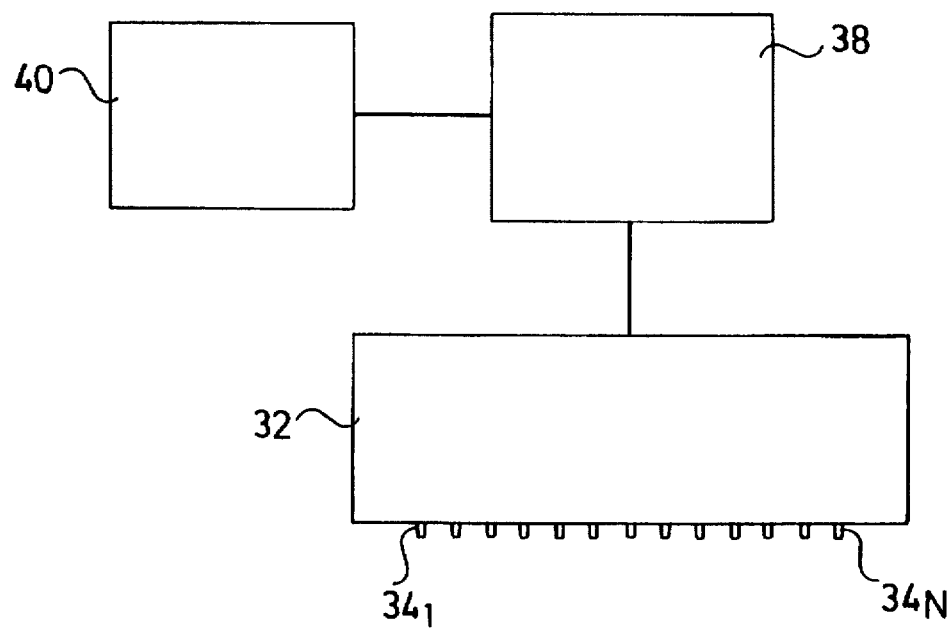
FIG. 5 is a schematic illustration of individual components of an inventive control.

As illustrated in FIG. 5, the control comprises for this purpose a central computer unit 38 with a memory 40, in which the laser power provided for each semiconductor laser unit can be stored, and a power unit 34 which is controlled by the computer unit 38, has the $34_1$ to $34_N$ outputs for the semiconductor laser units $18_1$ to $18_N$ and supplies each semiconductor laser unit 18 with a current which corresponds to the power specified for this semiconductor laser unit $18_1$ to $18_N$.

Since a single fiber end face $28_1$ to $28_N$ in the end surface 26 is clearly associated with each semiconductor laser unit $18_1$ to $18_N$, one of the semiconductor laser units $18_1$ to $18_N$ is automatically clearly associated with each of the surface elements $30_1$ to $30_N$ of the target surface 16 so that the intensity in the respective surface element $30_1$ to $30_N$ can be controlled by control of the semiconductor laser unit $18_1$ to $18_N$.

It is therefore possible with the control to determine the power in each of the individual surface elements $30_1$ to $30_N$ within the target surface 16 in a defined manner and thereby realize different intensity profiles within the target surface 16, as illustrated in FIGS. 6A to D.

Figure 6A:
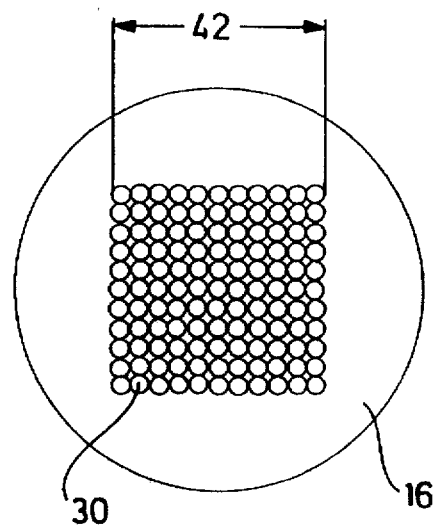
FIGS. 6A–6D are schematic illustrations of different intensity distributions within the target surface.

As illustrated in FIG. 6A, for example, only a surface area 42 having an outer square shape is irradiated within the target surface 16, i.e. all the surface elements 30 located within this area are irradiated by control of the corresponding semiconductor laser units 18 while the surface elements 30 located outside the surface area 42 are not irradiated as the corresponding semiconductor laser units 18 are switched off. In addition, the surface elements 30 are not irradiated with the same intensity within the surface area 42 but there is an intensity gradient between them, as schematically noted, in addition, in FIG. 6A. Such an irradiated surface area 42 is preferably used for treating materials, in particular for curing or hardening, whereby not only the shape of the surface area 42 but also the power gradient occurring within it are of importance.

Such a local power profile which is adapted in an optimum manner to the respective material treatment may be generated with optionally simple means via the control 32, whereby the semiconductor laser units 18 operated thereby operate in an optimum manner and no unnecessary power losses for generating this profile result.

Figure 6B:
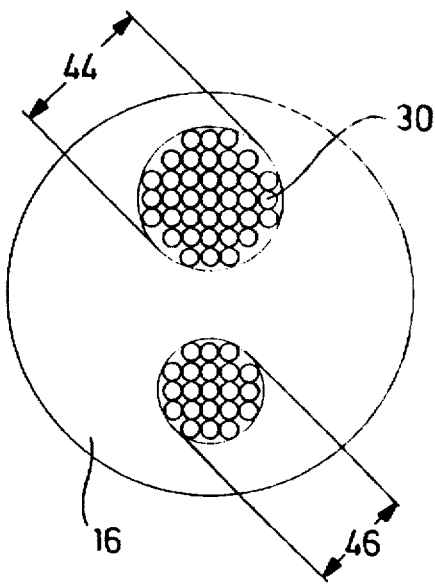

In a second variation, illustrated in FIG. 6B, a special shape of two irradiated surface areas 44 and 46 is illustrated. The surface area 44 represents a larger circle than the area 46 and within each area all the surface elements 30 are irradiated with the same intensity. Such a profile serves, for example, for preliminary or subsequent heating during alloying, whereby, for example, preliminary heating is carried out with the surface area 44 and the actual alloy work with the surface area 46. In this respect, it is also, for example, possible to irradiate the surface elements 30 within the surface area 46 with a higher power than the surface elements 30 within the surface area 42. None of the surface elements 30 outside the surface areas 44 and 46 are irradiated.

Figure 6C:
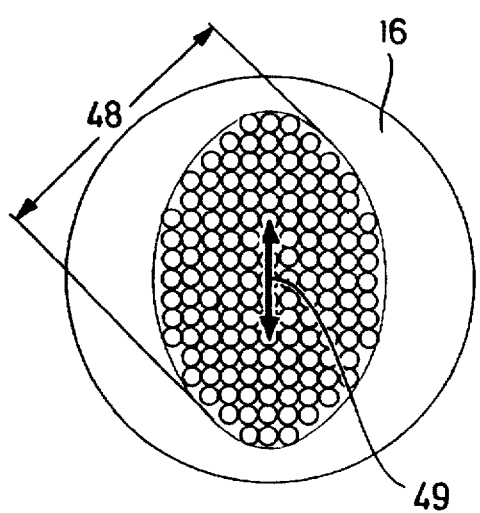

A third embodiment is illustrated in FIG. 6C. In this case, an oval surface area 48 is illuminated within the target surface 16, whereby this oval surface area 48 extends with its long axis 49 parallel to a direction of movement. Such an oval surface area is preferably used during welding, whereby the longitudinal direction of the weld seam extends approximately parallel to the long axis 49 of the oval surface area 48.

Preferably, all the surface elements 30 within the surface area 48 are irradiated with the same intensity. It is, however, also possible to provide an intensity gradient within the oval surface area.

Figure 6D:
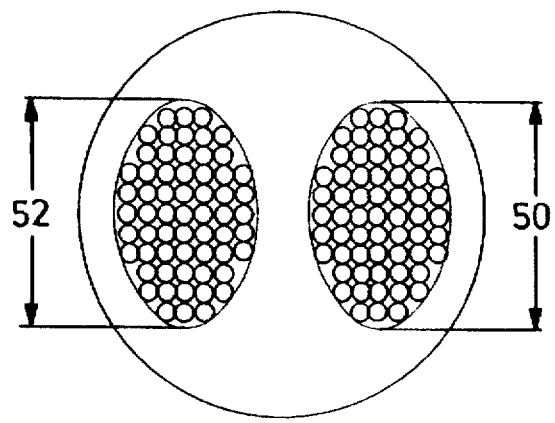

A third variation, illustrated in FIG. 6D, shows the irradiation of two longitudinally oval surface areas 50 and 52 located next to one another, whereby all the surface elements 30 within the surface areas 50 and 52 are irradiated with the same intensity.

Such an illumination of two longitudinally oval surface areas located next to one another is preferably used for the treatment of special geometrical structures.

Figure 7:
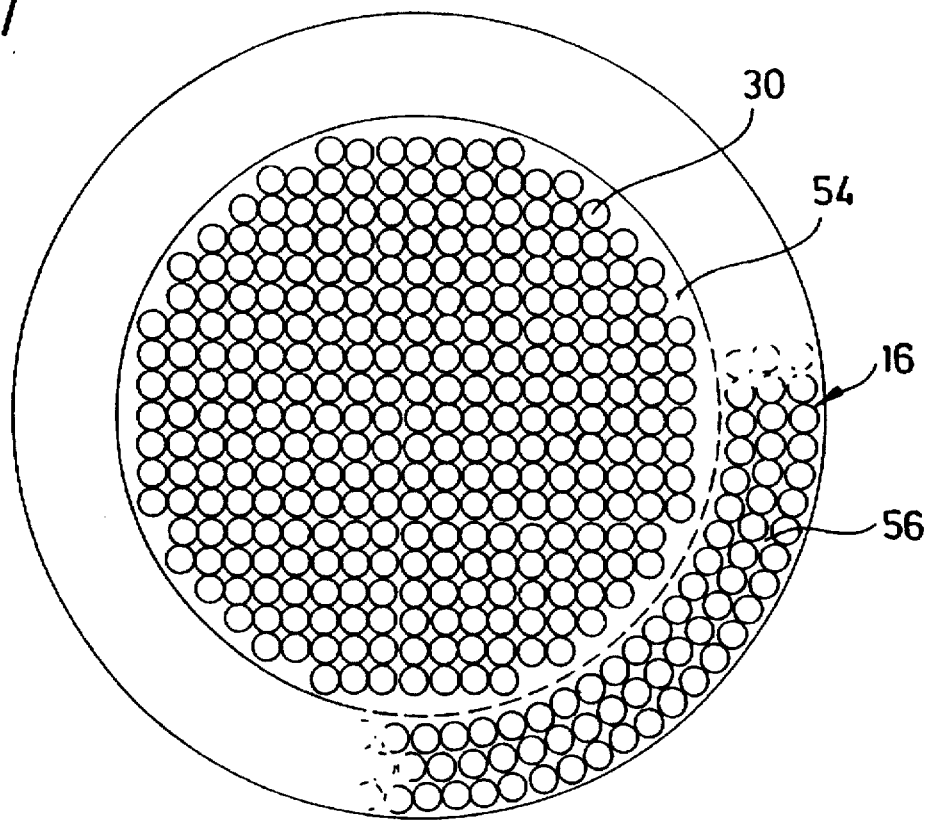
FIG. 7 is a schematic illustration of different intensity distributions in the target surface.

Apart from a merely local variation in the power within the target surface 16 it is also possible, as illustrated in FIG. 7, to provide within the target surface 16 a surface area 54, in which the impinging intensity oscillates temporally in all the surface elements 30 whereas the intensity does not oscillate in the individual surface elements 30 in a peripheral area 56 located outside the surface area 54. To make this clearer the two areas 54, 56 are separated by a dashed line.

In the embodiments described above, in which the fiber end faces 28 are imaged one-to-one onto the surface elements 30 of the target surface 16, an optical imaging means 60 is provided between the end surface 26 and the target surface 16, as illustrated in FIG. 1, and this is represented in the simplest case by a lens.

In this case, the total laser radiation 14 is formed by the sum of all the cone waves proceeding from all the fiber end faces 28 which, together, result in a beam bundle which is imaged by the optical imaging means onto the target surface 16 so that, in the simplest case, a one-to-one imaging of the fiber end faces 28 onto the surface elements 30 results.

If the fiber end faces have, however, a distance A between them, for example in the region of the thickness of one of the fibers and therefore of a diameter of a fiber end face 28, it is possible on the target surface 16 due to surface elements 30 arranged adjacent one another that the imaging does not correspond to the provisions of an exact geometrical imaging but that the target surface is located outside an image surface resulting during a geometrical imaging, for example between a focal plane and the image surface. This will, however, reduce the surface density of the impinging power.

Figure 8:
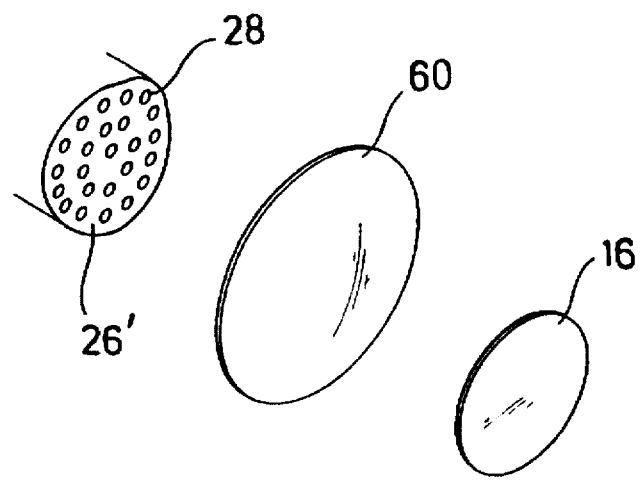
FIG. 8 is a schematic illustration of an adaptation of the fiber end face to an optical imaging means.

If the optical imaging means 60 has imaging errors so that it does not image a plane end surface 26 into a plane target surface 16, an additional, advantageous variation, illustrated in FIG. 8, provides for the end surface 26' to be designed not as a plane surface but as an end surface 26' curved in accordance with the imaging errors of the optical imaging means 60. Thus, with this end surface 26' it is possible to compensate for the imaging errors of the optical imaging means 60 and all the fiber end faces 28 are imaged onto a plane as target surface 16 or a different desired surface shape of the target surface 16.

Figure 9:
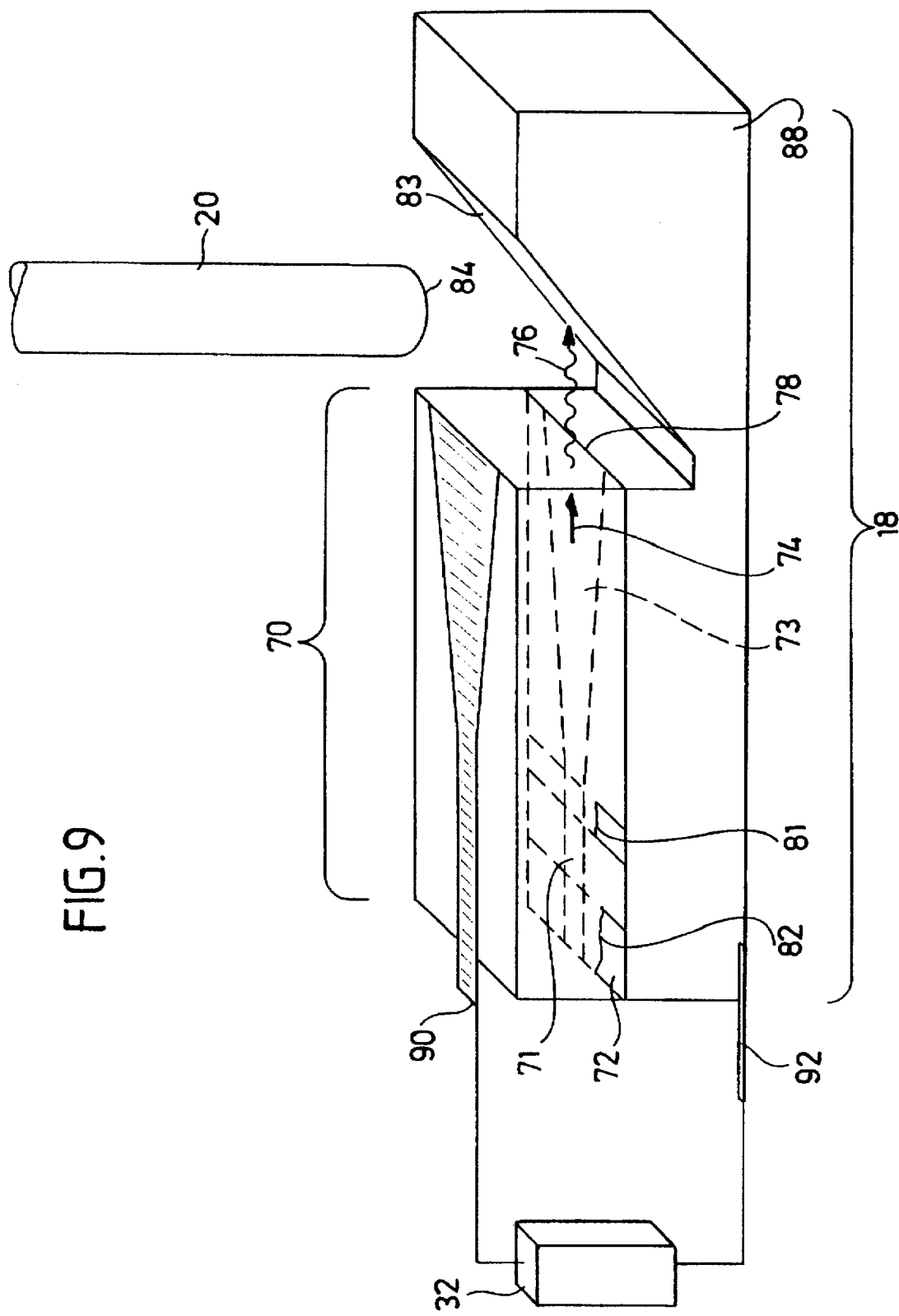
FIG. 9 is a schematic illustration of a semiconductor laser unit and the coupling of the laser radiation to a fiber in a first variation.

Each of the semiconductor laser units 18 comprises in the simplest case, as illustrated in FIG. 9, a laser diode 70 with a correspondingly doped laser-active layer 72 which comprises a laser oscillator 71, limited by phase gratings 81 and 82, and a laser amplifier 73 following directly on from this. The laser-active layer extends in a longitudinal direction 74 and in this layer a laser radiation is built up which propagates in the longitudinal direction 74 and exits from one end 78 of the laser-active layer 72 whereas it is reflected into an opposite end region 80 of the laser-active layer, for example, by the phase grating 82.

The laser radiation 76 exiting from the end 78 is reflected by a mirror 83 and coupled into an end 84 of the fiber 20 associated with the semiconductor laser unit 18, this end 84 facing the mirror 83. The mirror 83 is preferably designed as a mirror 83 focusing transversely to the longitudinal direction 74 since the laser radiation 76 diverges transversely to the longitudinal direction towards the end 78 and exits from the end 78 in this form.

In the simplest case, as illustrated in FIG. 9, the mirror 83 is an integral element of a substrate 88 which bears the laser diode 70 and into which the mirror 83 is formed with the desired inclination relative to the end 78.

The laser diode 70 is supplied with current via two supply lines 90 and 92, whereby the supply line 92 is connected to the substrate 88 and the supply line 90 to a contact line attached to the laser diode 70.

The power of the semiconductor diode 70 is controllable via a voltage and current characteristic at the connections 90 and 92 which is specifiable by the control 32.

Figure 10:
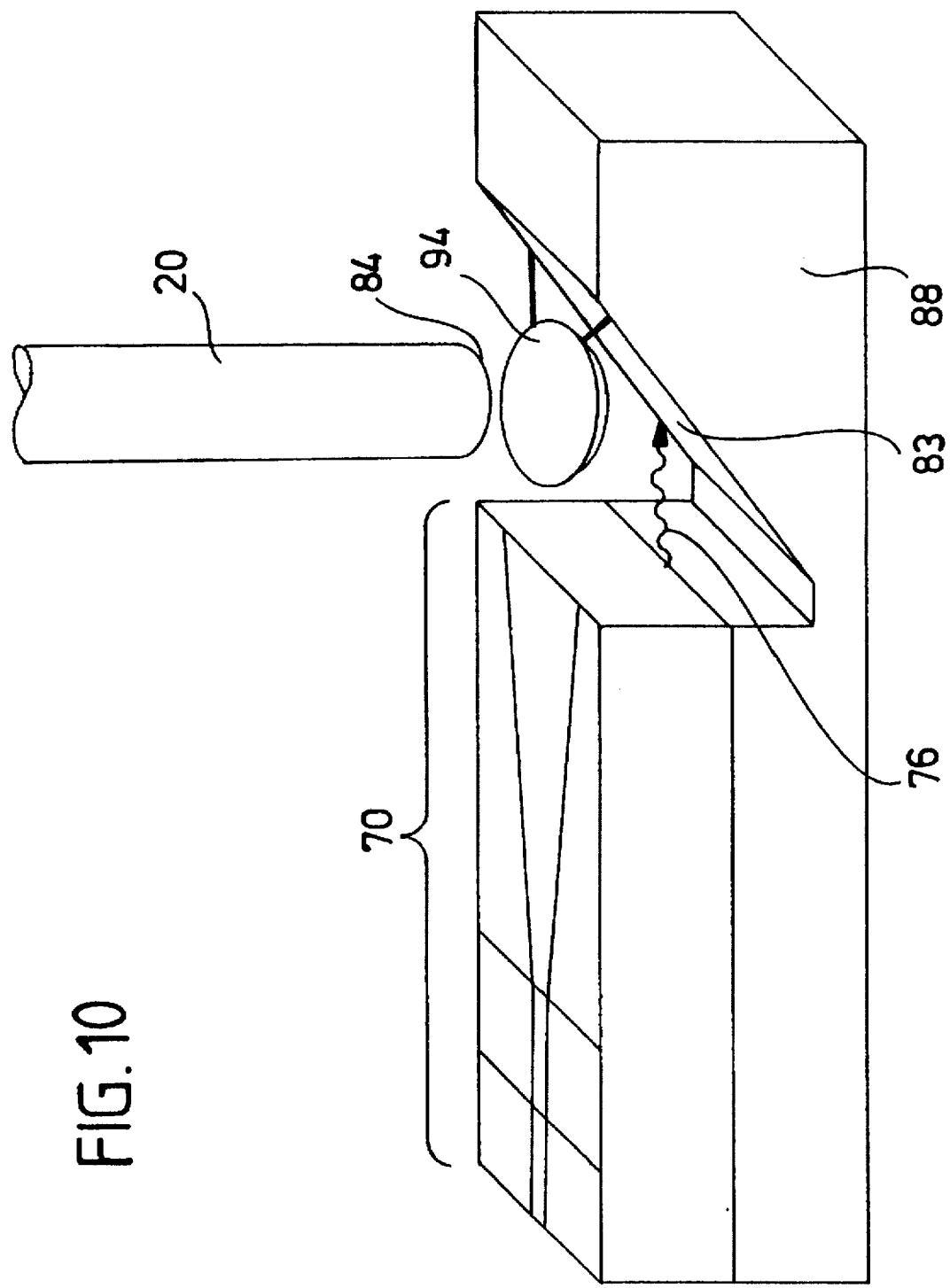
FIG. 10 is a schematic illustration of the relations in FIG. 9 in a second variation.

In a further variation of an inventive semiconductor laser unit 18, illustrated in FIG. 10, the laser diode 70 has the same construction as in the variation illustrated in FIG. 9. All the elements have therefore been given the same reference numerals so that with respect to their description reference can also be made to the comments on the preceding variation.

Only the mirror 83 is designed as a plane mirror and a lens 94 is provided for compensating the divergence of the laser radiation 76. This lens couples the laser radiation 76 into the end 84 essentially loss-free. The lens 94 is preferably likewise held on the substrate 88 which also bears the mirror 83.

Figure 11:
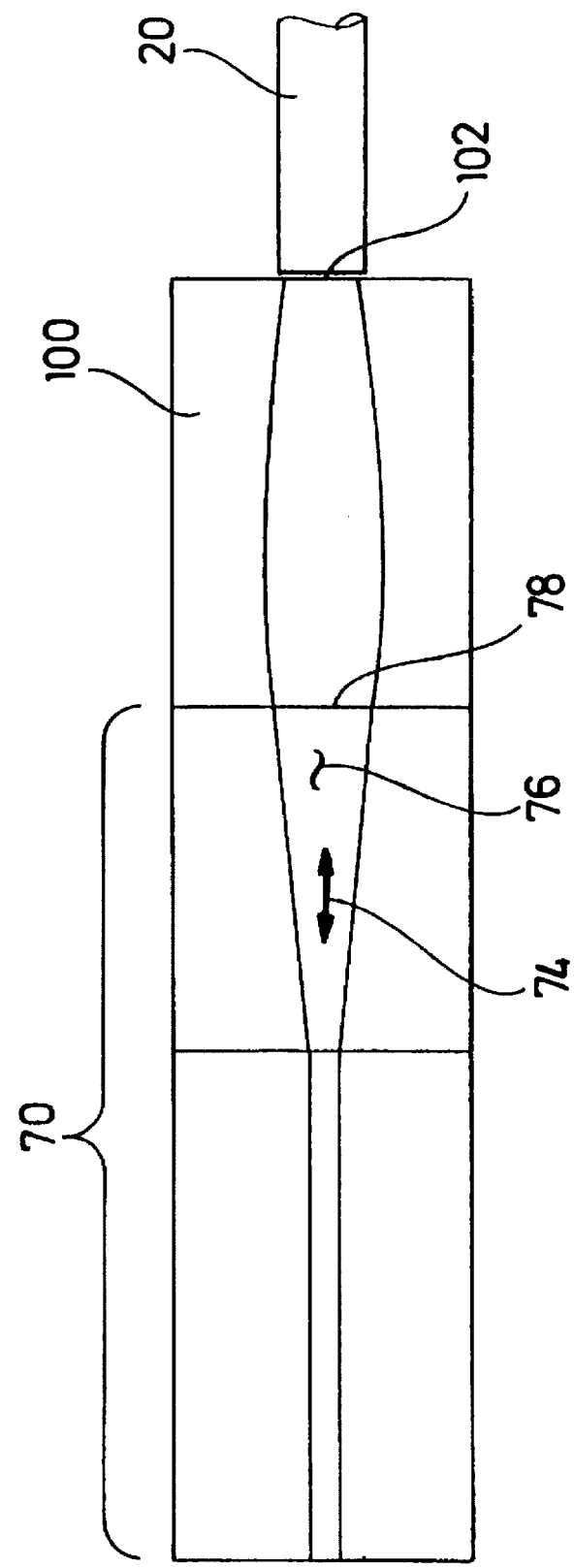
FIG. 11 is a schematic illustration of a semiconductor laser unit and the coupling of the laser radiation into a fiber in a third variation.

In a further variation of an inventive semiconductor laser unit, illustrated in FIG. 11, the laser diode 70 is of the same design as in the two variations described above and the same reference numerals have again been used. With respect to the description of the individual elements reference is therefore made in full to the preceding variations.

In contrast to the preceding variations, an index lens 100 follows on directly from the end 78, namely in longitudinal direction 74, and this lens compensates for the divergence of the laser radiation 76 and couples it into an end 102 of the fiber 20 associated with this semiconductor laser unit 18, this end following the index lens 100 in the longitudinal direction 74.

In accordance with the invention, all the semiconductor units 18 of the first embodiment, illustrated in FIG. 1, are constructed such that they supply laser radiation with essentially the same wavelength which is combined to form the total laser radiation 14.

Figure 12:
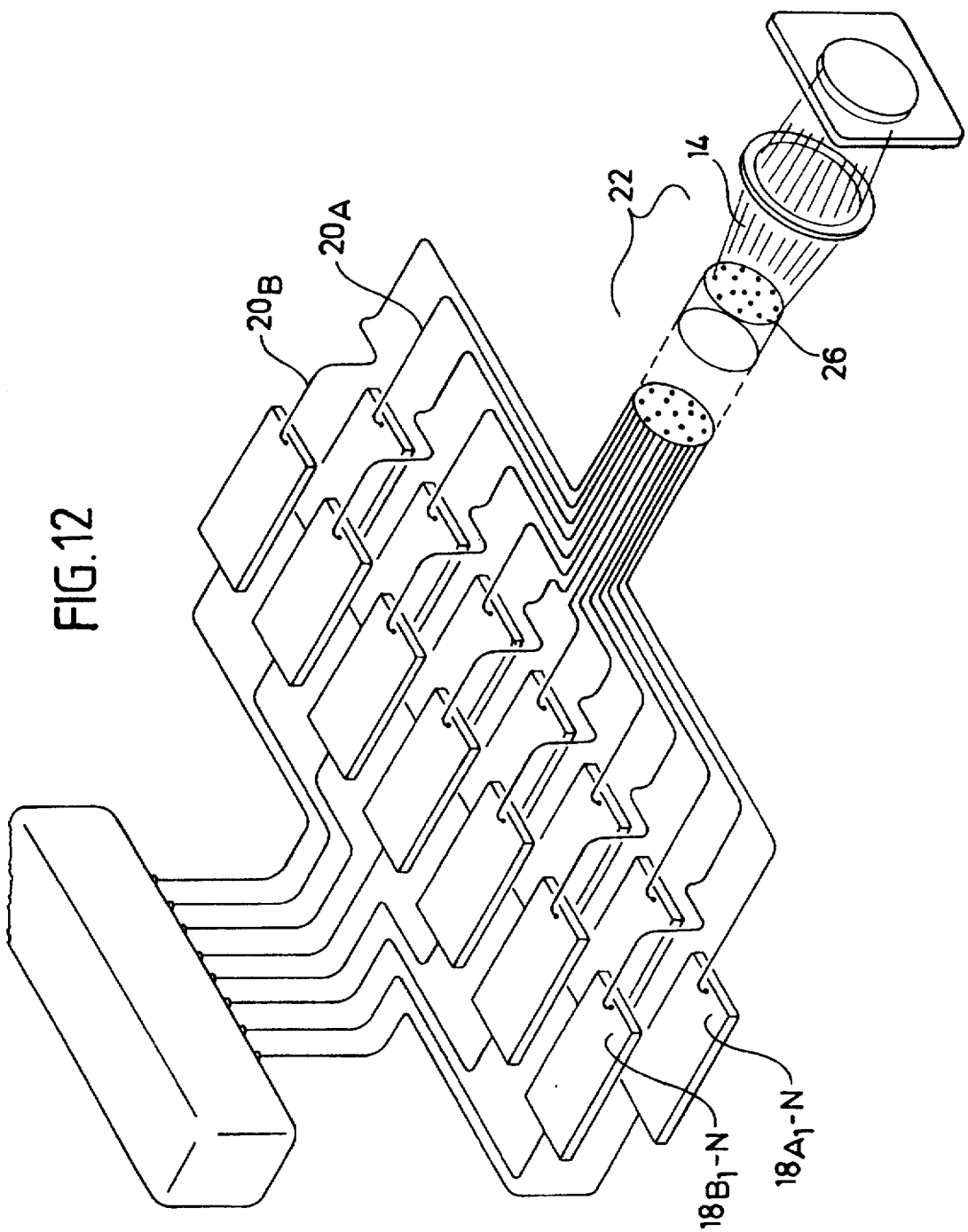
FIG. 12 is a schematic illustration of a second embodiment with different groups of semiconductor laser units.

In contrast to the first embodiment, two groups of semiconductor laser units $18A_{1 \text{ to } N}$ and $18B_{1 \text{ to } N}$ are provided in a second embodiment, illustrated in FIG. 12, whereby the semiconductor laser units $18A_{1 \text{ to } N}$ operate at one wavelength and the semiconductor laser units $18B_{1 \text{ to } N}$ at a second wavelength differing from the first.

Figure 13:
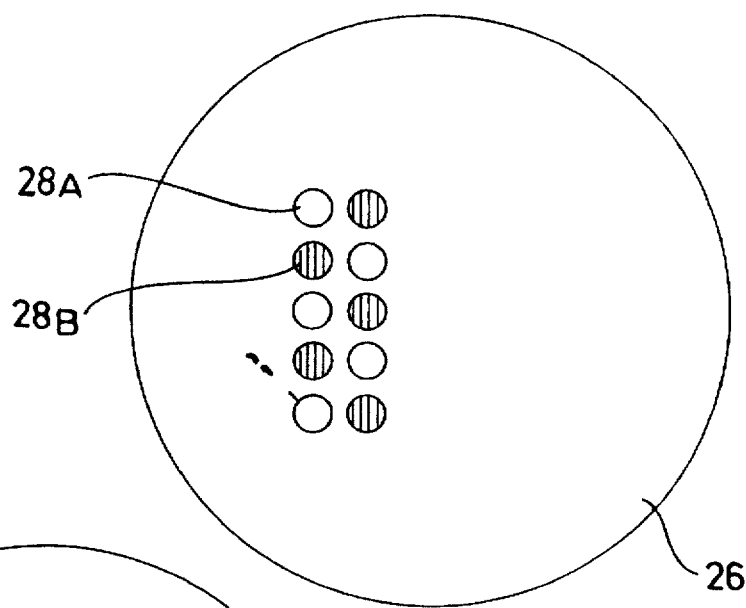
FIG. 13 is a plan view onto a fiber end face in a first variation of the second embodiment.

Fibers 20A lead from these semiconductor laser units 18A and fibers 20B from the semiconductor lasers 18B and these fibers are all combined to form a fiber bundle 22. The fibers 20A and 20B are guided in the fiber bundle 22 such that in the end surface 26, as illustrated in FIG. 13, a fiber end face 28B associated with one of the semiconductor laser units having the second wavelength is located next to a fiber end face 28A associated with one of the semiconductor laser units having the first wavelength etc., i.e. the fiber end faces 28A and 28B for laser radiation of differing wavelength alternate with one another.

Figure 14:
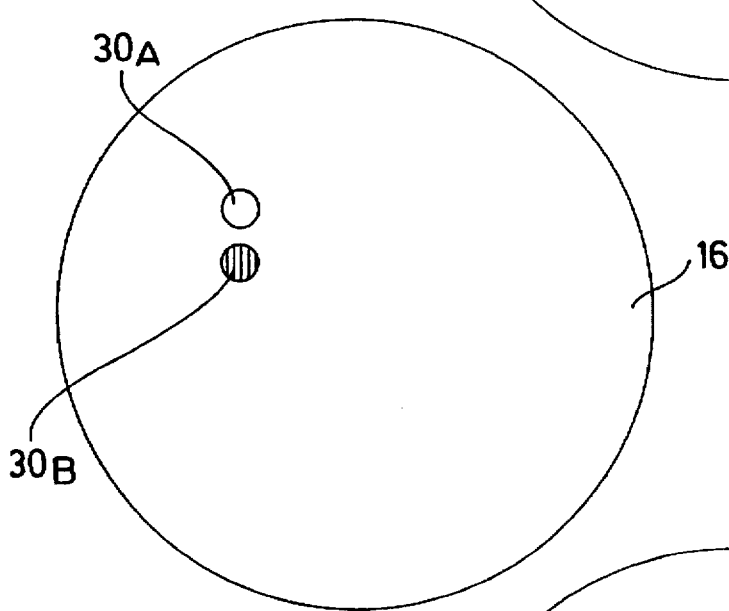
FIG. 14 is a plan view onto a target surface in the first variation.
Figure 15:
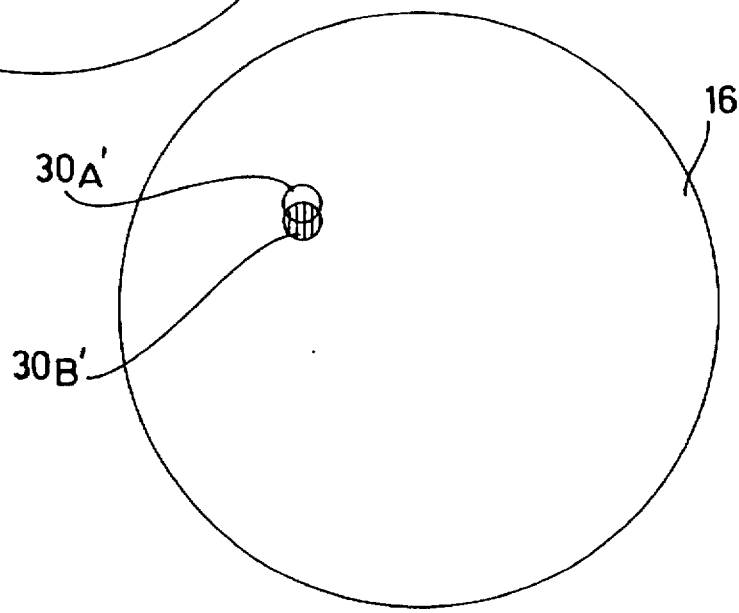
FIG. 15 is a plan view onto the target surface in a second variation.

According to the imaging selected, it is then possible to image the fiber end faces 28A and 28B onto the target surface 16 such that in the target surface a surface element 30A is located next to a surface element 30B, as illustrated in FIG. 14. Alternatively, it is possible to select the imaging such that the surface elements 30A' and 30B' overlap one another and, as illustrated in FIG. 15, form a common surface area on the target surface 16 so that in this area, resulting from the overlapping of the two surface elements 30A' and 30B', an irradiation is possible with one or the other wavelength or a mixture of both wavelengths.

Figures 16, 17:
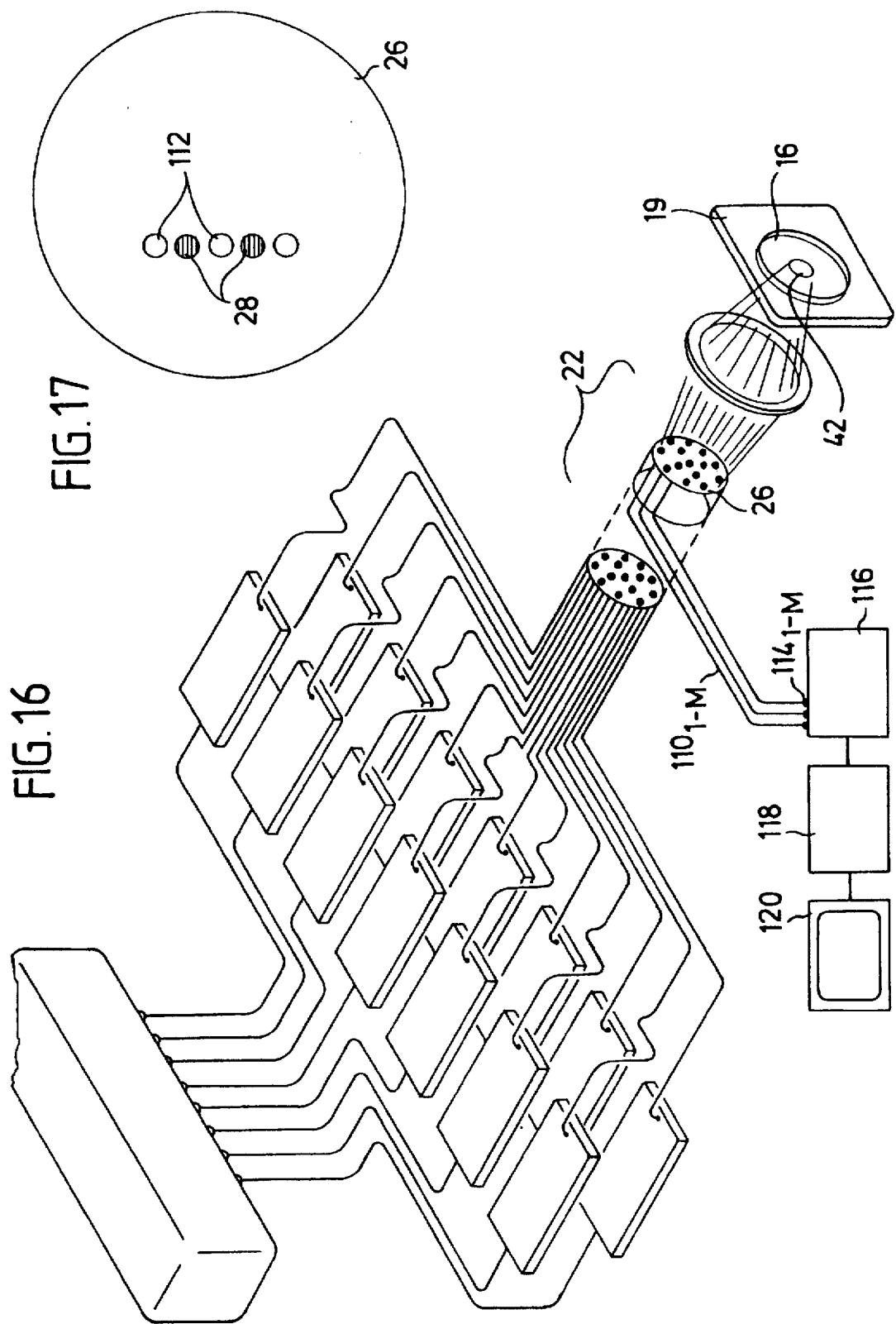
FIG. 16 is a schematic illustration of a third embodiment of an inventive semiconductor laser system and FIG. 17 is a plan view onto the fiber end face in the third embodiment.

A third embodiment of an inventive semiconductor laser system, illustrated in FIG. 16, is, in principle, of the same construction as the two preceding embodiments so that the same reference numerals are used for the same parts.

In contrast to the embodiments described above, however, detector fibers $110_{1 \text{ to } M}$ are provided in addition in the fiber bundle 22 and these detector fibers, as illustrated in FIGS. 16 and 17, are located with their fiber end faces $112_{1 \text{ to } M}$ in a regular pattern between the fiber end faces 28 in the end surface 26 so that an imaging of the fiber end faces 112 onto the target surface takes place in the same way as the imaging of the fiber end faces 28.

Ends $114_{1 \text{ to } M}$ of the detector fibers 110 located opposite the fiber end faces $112_{1 \text{ to } M}$ end on a detector matrix 116 which individually detects the radiation received, namely that received by the fiber end face 112, for each individual detector fiber $110_{1 \text{ to } M}$.

An image of the target surface 16 can therefore be detected with this detector matrix 116, whereby an image of the target surface can be represented on a screen 120 by means of a corresponding image processing device 118.

Preferably, the number of detector fibers $110_{1-M}$ worked into the fiber bundle 22 is such that a sufficiently exact representation of an image of the irradiated target surface on the screen 120 is possible and, thus, an exact observation of the irradiated surface areas 42 of the target surface 16.

In addition, the screen offers the possibility of recording not only the position of the irradiated surface areas 42 but also their relative position in relation to the surface of the workpiece, i.e. in relation to a weld seam to be made, so that it is then possible, in turn, to specify the local intensity distribution within the target surface in a defined manner to the control 32 and even more exactly.

For example, it is possible to carry out an exact alignment of the surface area 42 relative to the surface of the workpiece or object 19, for example to a weld seam thereon, by displacing the irradiated surface area 42 within the target surface 16.

We claim:

1. A semiconductor laser system, comprising:

a plurality of groups of semiconductor laser units;

each group comprising a plurality of semiconductor laser units;

each of said laser units comprising a laser oscillator;

each of the laser units in a group being adapted to operate in the same transversal basic mode and the same longitudinal single mode to generate coherent laser radiation having the same wavelength;

a single mode light-conducting fiber associated with each of said laser units;

a coupling element for coupling the laser radiation exiting from each of said laser units into the respective single mode light-conducting fiber;

said fibers having respective fiber end faces;

said fibers forming a fiber bundle such that said fiber end faces form a bundle end face of said fiber bundle;

all of said fiber end faces corresponding to one of said groups of laser units for emitting the same wavelength being combined to form an irradiation group, each of said irradiation groups being adapted to emit laser radiation with a different wavelength;

said fiber end faces within each of said irradiation groups being arranged adjacent to one another in said bundle end face;

said coherent laser radiation being generated by the respective laser units and exiting from said bundle end face to form a total laser radiation which illuminates a target surface on an object to be irradiated during laser activity of all the laser units; and a control for controlling the power of each individual laser unit in a defined manner to provide an irradiation of different surface elements of the target surface with an individually definable intensity for each surface element.

2. A semiconductor laser system as defined in claim 1, wherein:
a locally varying irradiation profile for the target surface is specifiable to the control.

3. A semiconductor laser system as defined in claim 1, wherein:
a temporally varying irradiation profile of the target surface is specifiable to the control.

4. A semiconductor laser system as defined in claim 1, wherein:
the fiber end faces of the fibers, from which the laser radiation of the associated semiconductor laser units exits, are located in an end surface of the fiber bundle which is optically imageable onto the target surface.

5. A semiconductor laser system as defined in claim 4, wherein:
a space between the fiber end faces is smaller than three times the fiber thickness.

6. A semiconductor laser system as defined in claim 5, wherein:
the fiber end faces lie next to one another in the end surface of the fiber bundle.

7. A semiconductor laser system as defined in claim 4, wherein:
the shape of the end surface of the fiber bundle is adapted to a shape of the surface of the object to be irradiated in the region of the target surface.

8. A semiconductor laser system as defined in claim 1, wherein:
the laser radiation of different semiconductor laser units impinges at least partially on different surface elements of the target surface.

9. A semiconductor laser system as defined in claim 1, wherein:
the laser radiation of different groups of semiconductor laser units impinges on different surface elements of the target surface.

10. A semiconductor laser system as defined in claim 1, wherein:
within one group of semiconductor laser units, each of said semiconductor laser units is adapted to emit laser radiation that is superposed on the target surface with the laser radiation of the other semiconductor laser units.

11. A semiconductor laser system as defined in claim 1, wherein:
an optical imaging means is provided between the end of the fiber bundle and the target surface.

12. A semiconductor laser system as defined in claim 1, wherein:
a shape of the end surface of the fiber bundle is adapted to optical imaging properties of the optical imaging means.

13. A semiconductor laser system as defined in claim 1, wherein:
each semiconductor laser unit comprises a single laser-active diode strip.

14. A semiconductor laser system as defined in claim 1, wherein:
each semiconductor laser unit comprises a plurality of laser-active diode strips.

15. A semiconductor laser system as defined in claim 1, wherein:
each semiconductor laser unit comprises a laser amplifier.

16. A semiconductor laser system as defined in claim 1, wherein:
an imaging element borne by the substrate of the semiconductor laser unit is provided as a coupling element for coupling one of said fibers to a respective one of said semiconductor laser units.

17. A semiconductor laser unit as defined in claim 16, wherein:
the imaging element focuses the laser radiation propagating in a direction parallel to the layer planes of the semiconductor laser unit onto the fiber.

18. A semiconductor laser system as defined in claim 1, wherein:
the fiber bundle comprises detector fibers.

19. A semiconductor laser system as defined in claim 18, wherein:
one end of the detector fibers is located at the end of the fiber bundle.

20. A semiconductor laser system as defined in claim 19, wherein:
the end of the detector fibers is located at the end surface of the fiber bundle next to the fiber end faces.

21. A semiconductor laser system as defined in claim 19, wherein:
the ends of the detector fibers are imaged onto the target surface.

22. A semiconductor laser system as defined in claim 18, wherein:
an optical detector for observing the target surface is arranged at another end of the detector fibers.

23. A semiconductor laser system as defined in claim 22, wherein:
the optical detector is a matrix detector for observing the target surface.

24. A semiconductor laser system as defined in claim 23, wherein:
said control is responsive to said optical detector for controlling the power of said semiconductor laser units.

25. A semiconductor laser system as defined in claim 23, wherein:
said optical detector is used to provide an alignment of said object to be irradiated relative to said total laser radiation.

26. A semiconductor laser system as defined in claim 1, wherein:
a wavelength of the radiation from at least one of said groups of semiconductor laser units is within a visible range to allow beam visualization.

27. A semiconductor laser system as defined in claim 1, wherein:
said plurality of semiconductor laser units of at least one of said groups of laser units are laser diodes; and
the power of each of said laser units is controlled individually by said control according to an electric current which is supplied to the laser units by said control.

28. A semiconductor laser system, comprising:
a plurality of groups of semiconductor laser units;
each group comprising a plurality of semiconductor laser units;

each of said laser units comprising a laser oscillator;

each of the laser units in a group being adapted to operate in the same transversal basic mode and the same longitudinal single mode for generating coherent laser radiation having the same wavelength;

a single mode light-conducting fiber associated with each of said laser units;

a coupling element for coupling the laser radiation exiting from each of said laser units into the respective single mode light-conducting fiber;

said fibers having respective fiber end faces;

said fibers forming a fiber bundle such that said fiber end faces form a bundle end face of said fiber bundle;

all of said fiber end faces corresponding to one of said groups of laser units for emitting the same wavelength being combined to form an irradiation group, each of said irradiation groups being adapted to emit laser radiation with a different wavelength;

said fiber end faces within each of said irradiation groups being arranged adjacent to one another in said bundle end face;

said coherent laser radiation being generated by the respective laser units and exiting from said bundle end face to form a total laser radiation which illuminates a target surface on an object to be irradiated during laser activity of all the laser units; and a control for controlling the power of each individual laser unit in a defined manner to provide an irradiation of different surface elements of the target surface with an individually definable intensity for each surface element; wherein:

an optical imaging means is provided between the end of the fiber bundle and the target surface;

the fiber end faces of the fibers, from which the laser radiation of the associated semiconductor laser units exits, are located in an end surface of the fiber bundle which is optically imageable onto the target surface; and the shape of the end surface of the fiber bundle is adapted to a shape of the surface of the object to be irradiated in the region of the target surface to compensate for an imaging error of said optical imaging means.

29. A semiconductor laser system comprising:

a plurality of groups of semiconductor laser units;

each group comprising a plurality of semiconductor laser units;

each of said laser units comprising a laser oscillator;

each of the laser units in a group being adapted to operate in the same transversal basic mode and the same longitudinal single mode for generating coherent laser radiation having the same wavelength;

a single mode light-conducting fiber associated with each of said laser units;

a coupling element for coupling the laser radiation exiting from each of said laser units into the respective single mode light-conducting fiber;

said fibers having respective fiber end faces;

said fibers forming a fiber bundle such that said fiber end faces form a bundle end face of said fiber bundle;

all of said fiber end faces corresponding to one of said groups of laser units for emitting the same wavelength being combined to form an irradiation group, each of said irradiation groups being adapted to emit laser radiation with a different wavelength;

said fiber end faces within each of said irradiation groups being arranged adjacent to one another in said bundle end face;

said coherent laser radiation being generated by the respective laser units and exiting from said bundle end face to form a total laser radiation which illuminates a target surface on an object to be irradiated during laser activity of all the laser units; and a control for controlling the power of each individual laser unit in a defined manner to provide an irradiation of different surface elements of the target surface with an individually definable intensity for each surface element; wherein:

first and second ones of said semiconductor laser units are adapted to emit laser radiation that is superposed, at least in part, on the target surface.

30. A semiconductor laser system as defined in claim 29, wherein:

said first and second semiconductor laser units belong to the same group and therefore have a common longitudinal mode.

31. A semiconductor laser system as defined in claim 29, wherein:

said first and second semiconductor laser units belong to different groups and therefore have different longitudinal modes.

* * * * *